(12) United States Patent
Ishigami

(10) Patent No.: US 7,679,440 B2
(45) Date of Patent: Mar. 16, 2010

(54) FEEDFORWARD AMPLIFIER

(75) Inventor: Takeshi Ishigami, Hamura (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 12/057,791

(22) Filed: Mar. 28, 2008

(65) Prior Publication Data
US 2008/0252371 A1 Oct. 16, 2008

(30) Foreign Application Priority Data
Apr. 16, 2007 (JP) .............................. 2007-106689

(51) Int. Cl.
*H03F 1/26* (2006.01)
*H03F 1/00* (2006.01)
(52) U.S. Cl. ..................... 330/151; 330/149
(58) Field of Classification Search ................. 330/149, 330/151
See application file for complete search history.

(56) References Cited

U.S. PATENT DOCUMENTS 5,877,653 A * 3/1999 Kim et al. .................. 330/151
6,078,216 A * 6/2000 Proctor, Jr. ................. 330/151
6,104,241 A * 8/2000 Cova et al. .................. 330/151

FOREIGN PATENT DOCUMENTS

| JP | 9-238038 | 9/1997 |
|---|---|---|
| JP | 2001-326541 | 11/2001 |

* cited by examiner

*Primary Examiner*—Khanh V Nguyen
(74) *Attorney, Agent, or Firm*—Brundidge & Stanger, P.C.

(57) ABSTRACT

There is disclosed a feedforward amplifier for compensating for distortion produced in an amplifier. The feedforward amplifier controls the phase in a vector adjuster effectively. The feedforward amplifier has a first variable phase shifter PH1_1 or PH2_1 for varying the phase of a signal passed through the first variable phase shifter and a second variable phase shifter PH1_2 or PH2_2 for varying the signal passed through the first variable phase shifter in either or both of a distortion detection loop for detecting the distortion and a distortion compensation loop for compensating for the distortion. A phase control portion controls the amount of variation in phase in the first variable phase shifter and values of the amount of variation in phase are concentrated toward either one of relatively-larger directions or relatively-smaller directions, the amount of variation in phase in the second phase shifter is controlled according to the concentrated values.

3 Claims, 6 Drawing Sheets

FEEDFORWARD AMPLIFIER

INCORPORATION BY REFERENCE

The present application claims priority from Japanese application JP2007-106689 filed on Apr. 16, 2007, the content of which is hereby incorporated by reference into this application.

BACKGROUND OF THE INVENTION

The present invention relates to a feedforward (FF) amplifier for compensating for distortion produced in an amplifier and, more particularly, to a feedforward amplifier for effectively providing phase control in a vector adjuster.

In a wireless communication system such as a mobile communication system, distortion produced when a signal to be sent is amplified by an amplifier in a base station unit or the like is compensated for by a feedforward type distortion compensator.

FIG. 4 shows an example of configuration of a fundamental circuit of a feedforward amplifier that compensates for distortion by a feedforward method. For convenience of illustration, configuration portions of FIG. 4 which are similar to their counterparts of FIG. 1 that will be referenced in an embodiment described later are indicated by the same reference numerals as in FIG. 1. It is to be understood, however, this does not restrict the scope of the present invention unnecessarily.

The feedforward amplifier shown in FIG. 4 has three directional couplers (combiner/splitter devices) HYB1, HYB2, and HYB3. Two routes are present between the directional couplers HYB1 and HYB2. One of the two routes has a variable attenuator AT1_1, a variable phase shifter PH1_1, and a main amplifier AMP1. The other route has a coaxial delay line D1. Similarly, two routes are present between the directional couplers HYB2 and HYB3. One of these two routes has a coaxial delay line D2. The other route has a variable attenuator AT2_1, a variable phase shifter PH2_1, and an auxiliary amplifier AMP2. The feedforward amplifier further includes a control portion 11 for controlling the two variable attenuators AT1_1 and AT2_1 and the two variable phase shifters PH1_1 and PH2_1.

The feedforward amplifier is composed of two loops, i.e., a distortion detection loop L1 and a distortion compensation loop L2. The detection loop L1 is made up of two directional couplers HYB1, HYB2 and intervening components, i.e., variable attenuator AT1_1, variable phase shifter PH1_1, main amplifier AMP1, and coaxial delay line D1. The compensation loop L2 is made up of two directional couplers HYB2, HYB3 and intervening components, i.e., coaxial delay line D2, variable attenuator AT2_1, variable phase shifter PH2_1, and auxiliary amplifier AMP2.

In each of the loops L1 and L2, the gain can be varied by the variable attenuator AT1_1 or AT2_1 such that the amplifier side route and the delay line route are identical in amount of delay and gain but are 180° out of phase with each other for a signal to be treated. The phase can be varied by the variable phase shifter PH1_1 or PH2_1. Such variations in gain and phase are controlled by the control portion 11. Generally, the control portion 11 monitors the output levels from the directional couplers HYB2 and HYB3 and controls the variable attenuators and variable phase shifters so as to maximize or minimize the output levels. This is known as adaptive control.

In each of the loops L1 and L2, the gain or phase is adjusted by the variable attenuator AT1_1 or AT2_1 or by the variable phase shifter PH1_1 or PH2_1. This is known as vector adjustment.

SUMMARY OF THE INVENTION

If the amount of variation in phase due to absorption of moisture into the substrate and coaxial delay lines, the amount of variation in phase due to temperature, and the amounts of variations in phase due to various other factors are totalized, the total amount of variation in phase may not be sufficiently compensated for only by one phase shifter.

One conceivable method of solving this problem is to increase the number of variable phase shifters (hereinafter referred to as the first example of improvement). Another conceivable method is that the number of variable phase shifters is increased and that each individual phase shifter is controlled independently (hereinafter referred to as the second example of improvement).

The above-described first example of improvement is now described. FIG. 5 shows an example of configuration of a feedforward amplifier of this first example of improvement. The number of phase shifters in each of loops L1 and L2 is increased. For convenience of illustration, similar components are indicated by identical reference numerals in both FIGS. 4 and 5.

The feedforward amplifier shown in FIG. 5 is similar to the configuration shown in FIG. 4 except that another variable phase shifter PH1_2 is added behind the variable phase shifter PH1_1 in the distortion detection loop L1 and that another variable phase shifter PH2_2 is added behind the variable phase shifter PH2_1 in the distortion compensation loop L2. A control portion 12 controls the 2 variable attenuators AT1_1, AT2_1 and the 4 variable phase shifters PH1_1, PH1_2, PH2_1, and PH2_2.

The control portion 12 controls each variable phase shifter by the same control signal in each of the loops L1 and L2. As a result, the amount by which the phase can be adjusted within each of the loops L1 and L2 is doubled compared with the configuration shown in FIG. 4.

As a specific example, assuming that the amount by which the phase can be varied in each of the loops L1 and L2 of the configuration shown in FIG. 4 is 60°, the amount by which the phase can be varied in each of the loops L1 and L2 in the configuration shown in FIG. 5 is doubled to about 120°.

However, in the configuration of FIG. 4, if the phase in each phase shifter is controlled in units of 8 bits, for example, the phase can be controlled in units of 0.23°/bit (=60°/256 bits) when a phase variation is caused by the variable phase shifter PH1_1, PH2_1. In contrast, in the configuration of FIG. 5, if the phase in each phase shifter is controlled in increments of 8 bits, it is possible to provide control in increments of only 0.47°/bit (=120°/256 bits) when a phase variation occurs in the variable phase shifters PH1_1 and PH1_2 or variable phase shifters PH2_1 and PH2_2. The amount of variation in phase per bit is doubled. Hence, it is impossible to provide fine control.

In this way, the amount of variation in phase can be doubled but the unit of control is also doubled. Consequently, there is the problem that it is impossible to provide finer control.

The above-described second example of improvement is described. An example of configuration of a feedforward amplifier of this second example of improvement is shown in FIG. 1, in which the number of phase shifters in each of the loops L1 and L2 is increased to control each phase shifter independently. For convenience of illustration, similar components are indicated by the same reference numerals in both FIGS. 1 and 5. FIG. 1 will be referenced in an embodiment described later for convenience of illustration. It is to be understood, however, this does not restrict the scope of the present invention unnecessarily.

The feedforward amplifier shown in FIG. 1 is similar to the configuration shown in FIG. 4 except that another variable phase shifter PH1_2 is added behind the variable phase shifter PH1_1 in the distortion detection loop L1 and that another variable phase shifter PH2_2 is added behind the variable phase shifter PH2_1 in the distortion compensation loop L2. The control portion 1 controls the 2 variable attenuators AT1_1 and AT2_1 and the 4 variable phase shifters PH1_1, PH1_2, PH2_1, and PH2_2.

The control portion 1 controls the two variable phase shifters PH1_1 and PH1_2 separately (i.e., independently), the two phase shifters being in the distortion detection loop L1. Also, the control portion controls the two variable phase shifters PH2_1 and PH2_2 separately, the phase shifters being in the distortion compensation loop L2.

That is, the phases in the variable phase shifters PH1_1 and PH2_1 are allowed to vary invariably such that the phases are optimized in the same way as in the prior art. The phases in the added variable phase shifters PH1_2 and PH2_2 are made semifixed without applying the above-described adaptive control.

For instance, temperature correction can be made, for example, by varying a control value for the phase in the variable phase shifter PH1_2 according to the temperature. Furthermore, the control value for the phase in the variable phase shifter PH1_2 can be set by the input level to the amplifier AMP1 as well as by temperature.

FIG. 6 shows one example of a control value for the variable phase shifter PH1-2, the control value being plotted against the temperature or input level. In this graph, the horizontal axis indicates the temperature or input level. The vertical axis indicates the control value.

In the configuration of this second example of improvement, it is possible to provide control in increments of 0.23°/bit (=60°/256 bits) when the phase in each of the variable phase shifters PH1_1 and PH2_1 varies in a case where the phase in each phase shifter is controlled in increments of 8 bits. For example, fine control can be provided in the same way as in the prior-art example shown in FIG. 4.

In the configuration of the second example of improvement, the added variable phase shifters P1_2 and P2_2 can vary their phases if the parameter such as temperature or input level can be converted into an electrical signal and measured. However, if the parameter cannot be converted into an electrical signal such as phase variations due to moisture absorption into the substrate or due to phase variations caused by aging, it is still necessary that the variable phase shifters P1_1 and P2_1 take account of such variations in the same way as in the prior art. For example, as the frequency is increased, the amount of variation in phase increases. In addition, if the amplifier is stocked in high-temperature, high-humidity environments or the product is operated in totally moisture-free environments, there is the problem that a sufficient amount of phase variation cannot be achieved simply by the variable phase shifters P1_1 and P2_1.

As described previously, the feedforward amplifier cannot yet sufficiently control the phase in the vector adjuster (i.e., control of phases in the variable phase shifters PH1_1, PH1_2, PH2_1, and PH2_2). There is a demand for further development.

The present invention has been made in view of the foregoing circumstances in the prior art. It is an object of the present invention to provide a feedforward amplifier capable of effectively controlling the phase in a vector adjuster.

The above-described object is achieved in accordance with the teachings of the present invention by a feedforward amplifier for compensating for distortion produced in an amplifier, the feedforward amplifier being characterized in that at least one of the amplification route in a distortion detection loop for detecting the distortion and the distortion amplification route of a distortion compensation loop for compensating for the distortion is configured as follows.

A first variable phase shifter varies the phase of a signal by a variable amount. A second variable phase shifter varies the phase of the signal transmitted through the first variable phase shifter by a variable amount. A phase control portion controls the amount of variation in phase of the first variable phase shifter. When values of the amount of variation in phase are concentrated toward either one of relatively-larger direction(s) and relatively-smaller direction(s), the amount of variation in phase in the second phase shifter is controlled according to whether the values are concentrated toward either one of relatively-larger direction(s) and relatively-smaller direction(s).

Therefore, when the amount of variation in phase in the first variable phase shifter is controlled and values of the amount of variation in phase are concentrated toward either one of relatively-larger direction(s) and relatively-smaller direction(s), the adjustable range of phase can be extended by controlling the amount of variation in phase in the second variable phase shifter according to whether the values are concentrated toward either one of relatively-larger direction(s) and relatively-smaller direction(s). The phases in vector adjusters in the distortion detection loop and distortion compensation loop can be controlled effectively. With respect to the amount of variation in phase in the second phase shifter, the amount of variation is controlled only when values of the amount of variation in phase in the first variable phase shifter are unevenly distributed and control is required. Hence, the control operation is efficiently carried out.

The present invention can be applied to either one or both of the amplification route in the distortion detection loop and the distortion amplification route in the distortion compensation loop.

The first and second variable phase shifters can have the same or different characteristics.

The amounts of variation in phase in the first and second variable phase shifters can be controlled in various manners. In one embodiment, the amount of variation in phase in the first variable phase shifter is varied continuously or in small increments, while the amount of variation in phase in the second variable phase shifter is varied discretely (e.g., in larger increments).

Where values of the amount of variation in phase are concentrated toward either one of relatively-larger value(s) and relatively-smaller value(s) (e.g., when a value (control value) for controlling the amount of variation in phase has a proportional or inversely proportional relationship with the resulting amount of variation in phase), the control value may be concentrated toward either one of relatively-larger value(s) and relatively-smaller value(s). An example of the case in which values of the amount of variation in phase are concentrated toward either one of relatively-larger direction(s) and relatively-smaller direction(s) is that a given number of values of the amount of variation are concentrated toward either ones of relatively-larger value(s) and relatively-smaller value(s).

As an example, where values of the amount of variation in phase in the first variable phase shifter are mainly distributed on the larger side, a control is provided to increase the amount of variation in phase in the second variable phase shifter. Meanwhile, where values of the amount of variation in phase in the first variable phase shifter are mainly distributed on the smaller side, a control is provided to reduce the amount of variation in phase in the second variable phase shifter. Consequently, the apparent total range of amounts of variation in phase can be made wider.

Where the power supply of the feedforward amplifier is turned off and turned on the next time, the amount of variation in phase, for example, in the first variable phase shifter is initialized at a given value (e.g., 0). In a further example of configuration, the previous amount of variation in phase is stored in a memory, and a control is started from the stored value of amount of variation in phase.

Where the power supply for the feedforward amplifier is turned of and turned on the next time, with respect to the amount of variation in phase in the second variable phase shifter, for example, the previous amount of variation in phase is stored in a memory, and a control is started from the stored value of the amount of variation in phase. As a further example of configuration, the amount of variation in phase may be initialized at a given value (e.g., zero (0)).

Furthermore, when a given time is not yet passed since the power supply for the feedforward amplifier has been turned on, when the temperature is varying rapidly, or when the input level is varying rapidly, a configuration in which the amount of variation in phase in the second variable phase shifter is not controlled can also be used.

As described so far, according to the feedforward amplifier associated with the present invention, when a vector adjuster in a distortion detection loop or distortion compensation loop is equipped with two variable phase shifters and values of the amount of variation in the phase in the first variable phase shifter are mainly distributed on larger or smaller side, the amount of variation in phase in the second variable phase shifter is controlled. Therefore, the phase in the vector adjuster in the distortion detection loop or distortion compensation loop can be controlled effectively. With respect to the amount of variation in phase in the second variable phase shifter, a control is provided only when values of the amount of variation in phase in the first variable phase shifter are unevenly distributed and a necessity arises. In consequence, the control is provided efficiently.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention are hereinafter described with reference to the drawings.

Figure 1:
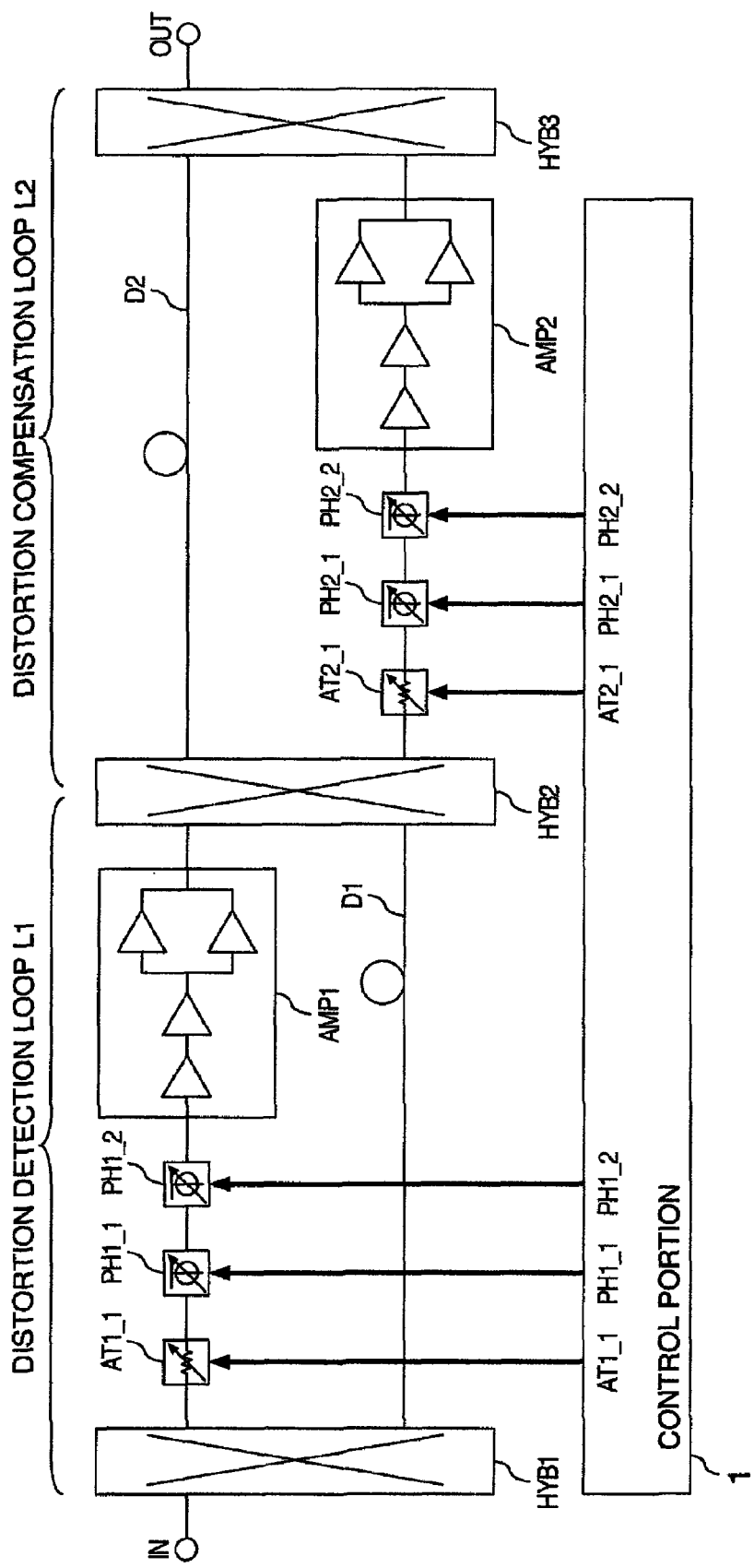
FIG. 1 is a diagram showing an example of configuration of a feedforward amplifier associated with one embodiment of the present invention.

FIG. 1 shows an example of circuit configuration of a feedforward amplifier associated with one embodiment of the present invention. The feedforward amplifier of the present embodiment has three directional couplers (combiner/splitter devices) HYB1, HYB2, and HYB3. Two routes are present between the directional couplers HYB1 and HYB2. One of the two routes has a variable attenuator AT1_1, two variable phase shifters PH1_1 and PH1_2, and a main amplifier AMP1. The other route has a coaxial delay line D1. Similarly, two routes are present between the directional couplers HYB2 and HYB3. One of these two routes has a coaxial delay line D2. The other route has a variable attenuator AT2_1, two variable phase shifters PH2_1 and PH2_2, and an auxiliary amplifier AMP2. The feedforward amplifier further includes a control portion 1 for controlling the two variable attenuators AT1_1 and AT2_1 and the four variable phase shifters PH1_1, PH1_2, PH2_1, and PH2_2.

Instead of the coaxial delay lines D1 and D2, filters capable of realizing a certain amount of delay may be used.

The feedforward amplifier of the present embodiment is composed of two loops, i.e., distortion detection loop L1 and distortion compensation loop L2. The detection loop L1 is made up of two directional couplers HYB1, HYB2 and intervening components therebetween. The intervening components are a variable attenuator AT1_1, two variable phase shifters PH1_1 and PH1_2, a main amplifier AMP1, and a coaxial delay line D1. The compensation loop L2 is made up of two directional couplers HYB2, HYB3 and intervening components therebetween. The intervening components are a coaxial delay line D2, a variable attenuator AT2_1, two variable phase shifters PH2_1 and PH2_2, and an auxiliary amplifier AMP2.

In each of the loops L1 and L2, the gain can be varied by the variable attenuator AT1_1, AT2_1 such that the amplifier side route and the delay line route are identical in amount of delay and gain but are 180° out of phase with each other. The phases can be varied by the variable phase shifters PH1_1, PH2_1, PH1_2, and PH2_2. Such variations in gain and phase can be controlled by the control portion 1.

The gain and phase are adjusted by the variable attenuators AT1_1, AT2_1 and variable phase shifters PH1_1, PH1_2, PH2_1, and PH2_2 in the loops L1 and L2. Because of these functions, the functions of the vector adjusters are achieved.

The control portion 1 controls the two variable phase shifters PH1_1 and PH1_2 in the distortion detection loop L1 independently (separately), and controls the two variable phase shifters PH2_1 and PH2_2 in the distortion compensation loop L2 independently (separately).

One example of operation performed in the feedforward amplifier of the present embodiment is described now. A signal to be amplified is applied to the directional coupler HYB1. The coupler HYB1 splits the input signal into two parts. One part is output to the variable attenuator AT1_1, while the other part is output to the coaxial delay line D1.

The variable attenuator AT1_1 attenuates the signal entered from the directional coupler HYB1 by an amount of attenuation controlled by the control portion 1 and outputs the attenuated signal to the variable phase shifter PH1_1.

The variable phase shifter PH1_1 varies the phase of the signal entered from the variable attenuator AT1_1 by an amount of variation controlled by the control portion 1 and outputs the varied phase to the variable phase shifter PH1_2.

The variable phase shifter PH1_2 varies the phase of the signal entered from the variable phase shifter PH1_1 by an amount of variation controlled by the control portion 1 and outputs the varied phase to the main amplifier AMP1.

The main amplifier AMP1 amplifies the signal entered from the variable phase shifter PH1_2 and outputs the amplified signal to the directional coupler HYB2. In the main amplifier AMP1, distortion to be compensated for is produced.

The coaxial delay line D1 delays the signal entered from the directional coupler HYB1 and outputs the delayed signal to the directional coupler HYB2.

The directional coupler HYB2 outputs the signal entered from the main amplifier AMP1 to the coaxial delay line D2, combines the signal entered from the main amplifier AMP1 and the signal entered from the coaxial delay line D1, and outputs the resulting signal to the variable attenuator AT2_1. The signal output to the variable attenuator AT2_1 contains the component of distortion (ideally, only distortional component) produced in the main amplifier AMP1.

The coaxial delay line D2 delays the signal entered from the directional coupler HYB2 and outputs the signal to the directional coupler HYB3. The variable attenuator AT2_1 attenuates the signal entered from the directional coupler HYB2 by an amount of attenuation controlled by the control portion 1 and outputs the attenuated signal to the variable phase shifter PH2_1.

The variable phase shifter PH2_1 varies the phase of the signal entered from the variable attenuator AT2_1 by an amount of variation controlled by the control portion 1 and outputs the varied phase to the variable phase shifter PH2_2. The phase shifter PH2_2 varies the phase of the signal entered from the variable phase shifter PH2_1 by an amount of variation controlled by the control portion 1 and outputs the varied phase to the auxiliary amplifier AMP2. The auxiliary amplifier AMP2 amplifies the signal entered from the variable phase shifter PH2_2 and outputs the amplified signal to the directional coupler HYB3.

The directional coupler HYB3 combines the signal entered from the coaxial delay line D2 and the signal entered from the auxiliary amplifier AMP2, and outputs the resulting signal as a signal indicating the result of distortion compensation.

Ideally, the signal entered from the coaxial delay line D2 includes the main signal (i.e., obtained by amplifying the original input signal) and a distortional component produced in the main amplifier AMP1. The signal entered from the auxiliary amplifier AMP2 contains the distortional component produced in the main amplifier AMP1. These signals are combined, whereby the distortional component is canceled out. As a result, a distortionless amplifier output signal is produced from the directional coupler HYB3.

In the feedforward amplifier of the present embodiment, the main amplifier AMP1 is an amplifier for which distortion is compensated. In the distortion detection loop L1, the route having variable attenuator AT1_1, variable phase shifters PH1_1, PH1_2, and main amplifier AMP1 is an amplification route. In the distortion compensation loop L2, the route having variable attenuator AT2_1, variable phase shifters PH2_1, PH2_2, and auxiliary amplifier AMP2 is a distortion amplification route.

In the feedforward amplifier of the present embodiment, the distortion detection loop L1 has the first variable phase shifter PH_1 used for control and the second variable phase shifter PH1_2 used for adjustment. The distortion compensation loop L2 has the first variable phase shifter PH2_1 used for control and the second variable phase shifter PH2_2 used for adjustment. The control portion 1 has the function of controlling the variable phase shifters PH1_1, PH1_2, PH2_1, and PH2_2. This function constitutes a phase control portion.

First Embodiment

Figure 2:
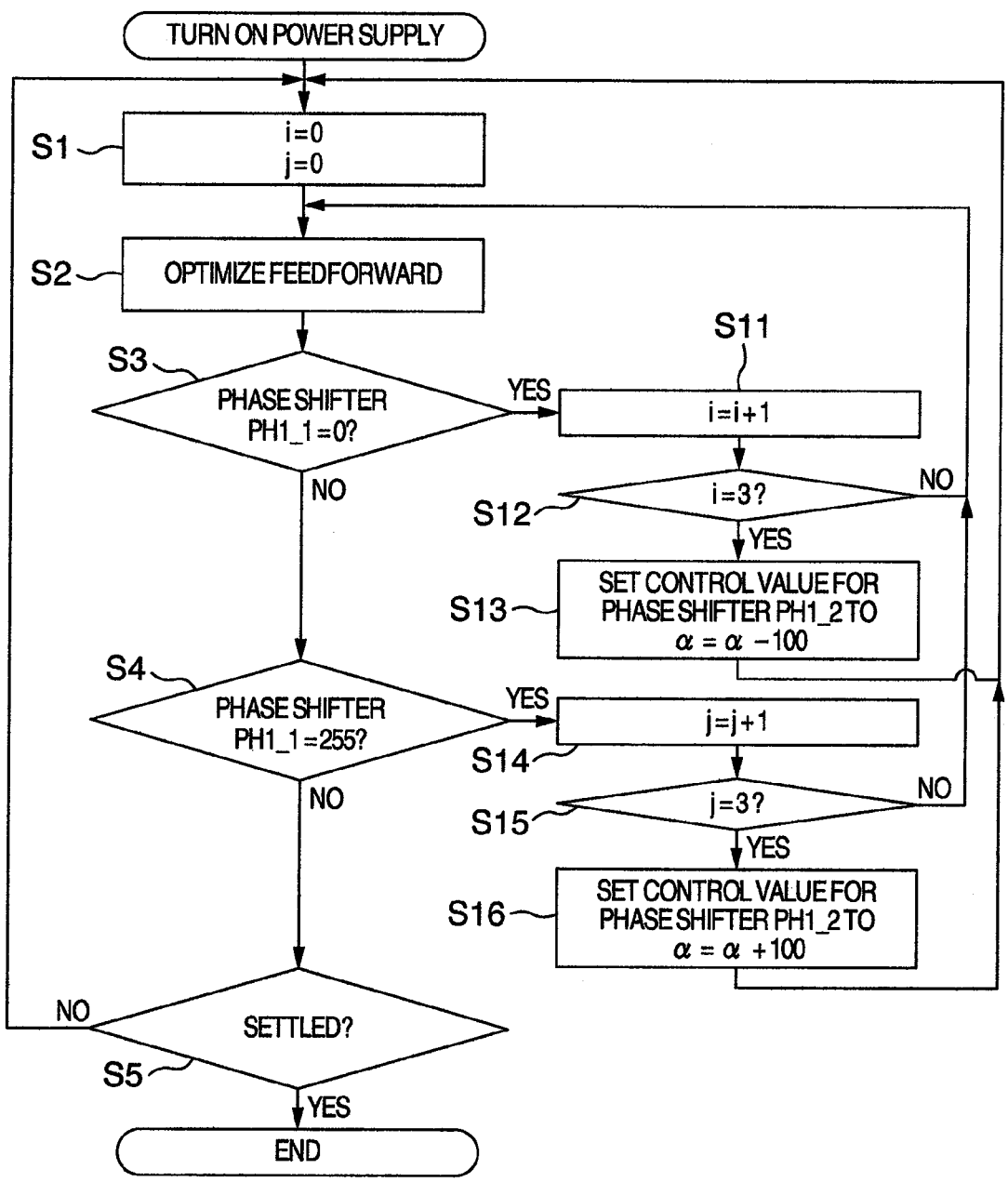
FIG. 2 is a flowchart illustrating a sequence of control operations performed in a feedforward amplifier associated with a first embodiment of the invention.

A first embodiment of the present invention is described. FIG. 2 illustrates one example of a sequence of operations for controlling the variable phase shifters PH1_1 and PH1_2 within the distortion detection loop L1 in the feedforward amplifier of the present embodiment shown in FIG. 1.

In the present embodiment, processing for controlling the variable phase shifters PH1_1 and PH1_2 within the distortion detection loop L1 is described. Processing for controlling the variable phase shifters PH2_1 and PH2_2 within the distortion compensation loop L2 can be performed similarly.

In the present embodiment, two counters assume values i and j, respectively. Furthermore, in the present embodiment, it is assumed that the control portion 1 controls the amounts of attenuation of the variable attenuators AT1_1 and AT2_1 and the amounts of variations in phase in the variable phase shifters PH1_1, PH1_2, PH2_1, and PH2_2, using a control signal of 8 bits indicating a control value from 0 to 255.

In addition, in the present embodiment, a control is provided so that as the value of the control signal indicating the control value from 0 to 255 decreases, the controlled amount (such as amount of attenuation and amount of variation in phase) is reduced, and vice versa. The relationship in magnitude between the value of the control signal (control value) and the controlled amount may be reversed as compared with the present embodiment.

First, when the power supply for the feedforward amplifier is switched from OFF state to ON state, the values of the counters i and j are initialized at 0 (step S1). Processing for optimizing the feedforward is started (step S2). The amount of attenuation of the variable atteuator AT1_1 and the amount of variation in phase in the variable phase shifter PH1_1 are adaptively controlled to optimize the gain and phase of the distortion detection loop L1.

At this time, with respect to the distortion compensation loop L2, too, the amount of attenuation of the variable attenuator AT2_1 and the amount of variation in phase in the variable phase shifter PH2_1 are varied to optimize the gain and phase in the distortion compensation loop L2. Because the operation is the same as for inside the distortion detection loop L1, its description is omitted below.

In processing for feedforward optimization, if the control value for the variable phase shifter P1_1 assumes a minimum value of 0 (step S3), the value of the counter i is incremented by 1 (step S11). If the value of the counter i reaches +3 before control settles down (step S12), a correction is made such that the control value α for the variable phase shifter P1_2 is varied to (α−100) (step S13). Control returns to the processing in which the values of the counters i and j are set to 0 (step S1). If the value of the counter i has not reached +3 (step S12), the processing for feedforward optimization is continued (step S2).

Where the control value for the variable phase shifter P1_1 assumes a maximum value of 255 during processing for feedforward optimization (step S4), the value of the counter j is incremented by 1 (step S14). If the value of the counter j reaches +3 before the control settles down (step S15), a correction is made such that the control value α for the variable phase shifter P1_2 is varied to (α+100) (step S16). Control returns to the processing for resetting the values of the counters i and j to 0 (step S1). If the value of the counter j has not reached +3 (step S15), the processing for feedforward optimization is continued (step S2).

A decision is made as to whether the control has settled down by the processing for feedforward optimization (step S5). If the control has settled down, the processing is terminated. Meanwhile, if the control has not settled down, control returns to the processing for resetting the values of the counters i and j to 0 (step S1). The processing for feedforward optimization is again performed (step S2). Alternatively, after step S13, the control value for the variable phase shifter P1_1 may be increased by 100. Still alternatively, after step S16, the control value may be reduced by 100.

Any arbitrary technique can be used to determine whether the control has settled down. For example, with respect to the distortion detection loop L1, if a control is provided so that the level of the signal output to the variable attenuator AT2_1 from the directional coupler HYB2 is detected and that the level is reduced (i.e., only distortional component is contained in the signal), a technique making it possible to determine that the control has settled down when the level has been equal to or less than a given threshold value can be used. With respect to the distortion compensation loop L2, if a control is provided so that the level of distortion contained in a signal output from the directional coupler HYB3 is detected and that the level is reduced, a technique making it possible to determine that the control has settled down when the level has been equal to or less than a given threshold value can be used.

If the control value for the variable phase shifter PH1_1 becomes "0" or "255" three times before the control has settled down as in the present embodiment, the phase in the variable phase shifter PH1_2 is automatically varied by an apparatus. Thus, the control range of the variable phase shifter P1_1 seems to have become wider.

As described so far, in the feedforward amplifier of the present embodiment, the vector adjuster in the distortion detection loop L1 is equipped with the two phase shifters, i.e., variable phase shifter PH1_1 used for phase control and variable phase shifter PH1_2 used for phase adjustment. The vector adjuster in the distortion compensation loop L2 is equipped with the two phase shifters, i.e., variable phase shifter PH2_1 used for phase control and variable phase shifter PH2_2 used for phase adjustment. Furthermore, in the present embodiment, in each of the loops L1 and L2, the amount of variations in phase in the two variable phase shifters PH1_1 and PH1_2 or PH2_1 and PH2_2 are controlled independently by variable amounts. In the present embodiment, in each of the loops L1 and L2, if values of the amounts of variations in phase in the controlling variable phase shifters PH1_1 and PH2_1 are concentrated toward either one of relatively-larger direction(s) and relatively-smaller direction(s), the phases of the adjusting variable phases PH1_2 and PH2_2 are switched.

In this way, in the feedforward amplifier of the present embodiment, the function of varying the phase in the vector adjuster in each of the loops L1 and L2 is achieved by two stages. The variable range of phases is substantially extended. Principally, the amount of variation in phase in one of the variable phase shifters PH1_1 and PH2_1 is adaptively controlled. When one limit of the variable range is reached, the number of times that the limit is reached is counted. If the count value reaches or exceeds a prescribed number, the amount of variation in phase in the other of the variable phase shifters PH1_2 and PH2_2 is varied.

Accordingly, in the feedforward amplifier of the present embodiment, a wider range of phases can be varied in adjusting vectors in each of the loops L1 and L2 when the phase is varied due to moisture absorption into the substrate, due to variations of the temperature of the substrate, or due to aging. Therefore, when the phase is varied greatly due to moisture absorption into the substrate, for example, variations in phase can be suppressed accordingly and appropriately. Furthermore, in the present embodiment, if the phase is varied by a large amount due to moisture absorption into the substrate, the feedforward control range of phase can be extended, for example, without adding any phase shifter.

The feature of the control method of the present embodiment shown in FIG. 2 is described below. In the present embodiment, after the amount of variation in phase in each of the adjusting variable phase shifters PH1_2 and PH2_2 is varied, if the power supply is once turned off, the previous value of the amount of variation in phase is stored in a memory. Therefore, if a variation occurs at all, the variable phase shifters PH1_2 and PH2_2 start control from the varied value (the amount of variation in phase) when the power supply is turned on the next time.

Furthermore, in the circuit of the feedforward amplifier of the present embodiment, if the power supply is activated, the ambient temperature varies rapidly, or the input level varies rapidly, it takes a long time until control settles down. In addition, the control value reaches "0" of or "255" multiple times (three times, in the present embodiment) until a focal point is found. As a result, the amounts of variations in phase in the variable phase shifters PH1_2 and PH2_2 may vary in a manner deviating from the intrinsic object.

Second Embodiment

A second embodiment of the present invention is described. The present embodiment provides improvements of the features of the control method shown in FIG. 2, i.e., the amounts of variations in phase in the variable phase shifters PH1_2 and PH2_2 are stored in a memory before the power supply is turned off and, when the power supply is activated or the temperature or input level varies rapidly, the amounts of variations in phase in the variable phase shifters PH1_2 and PH2_2 vary in a manner different from the intrinsic object.

Figure 3:
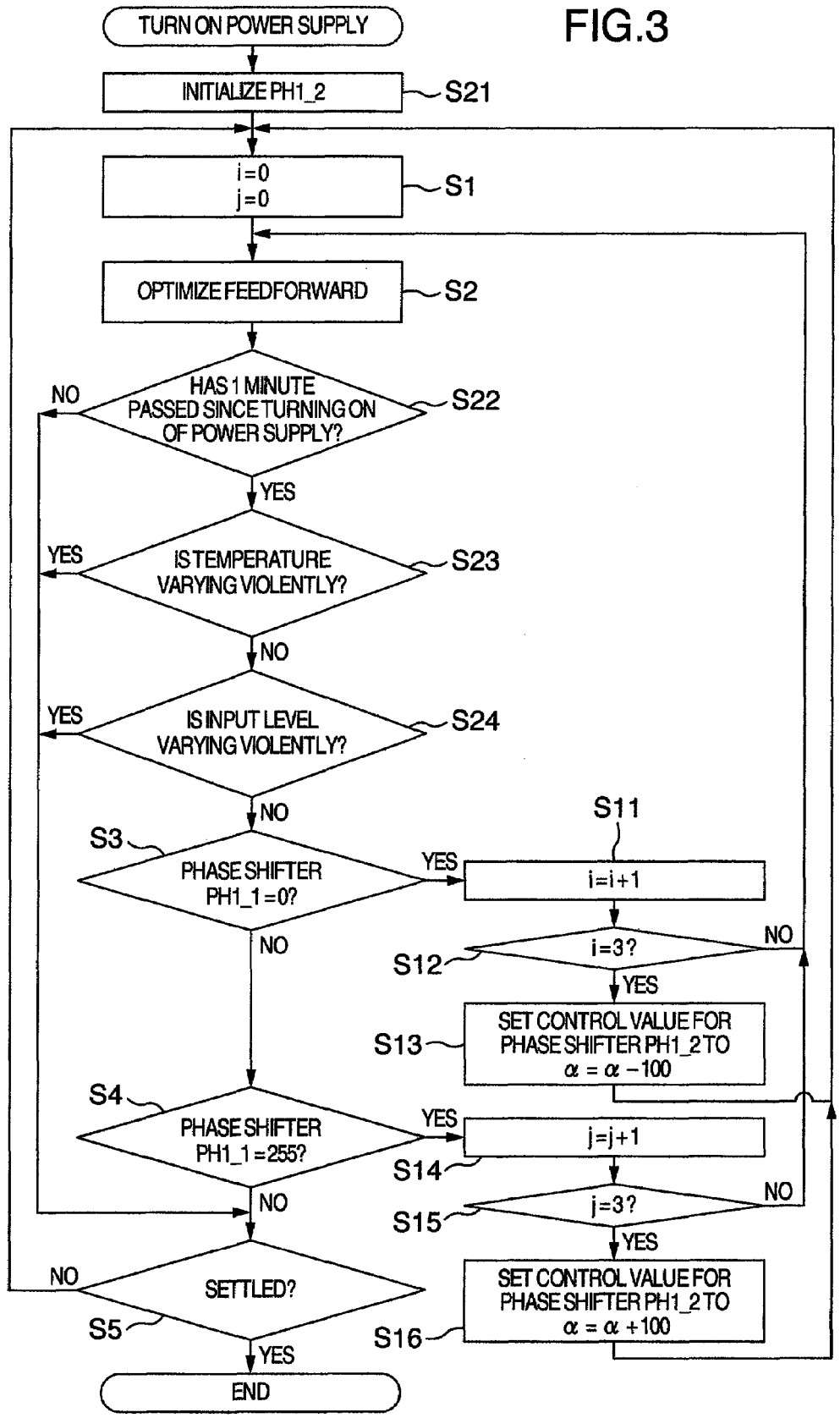
FIG. 3 is a flowchart illustrating a sequence of control operations performed for a feedforward amplifier associated with a second embodiment of the invention.
Figure 4:
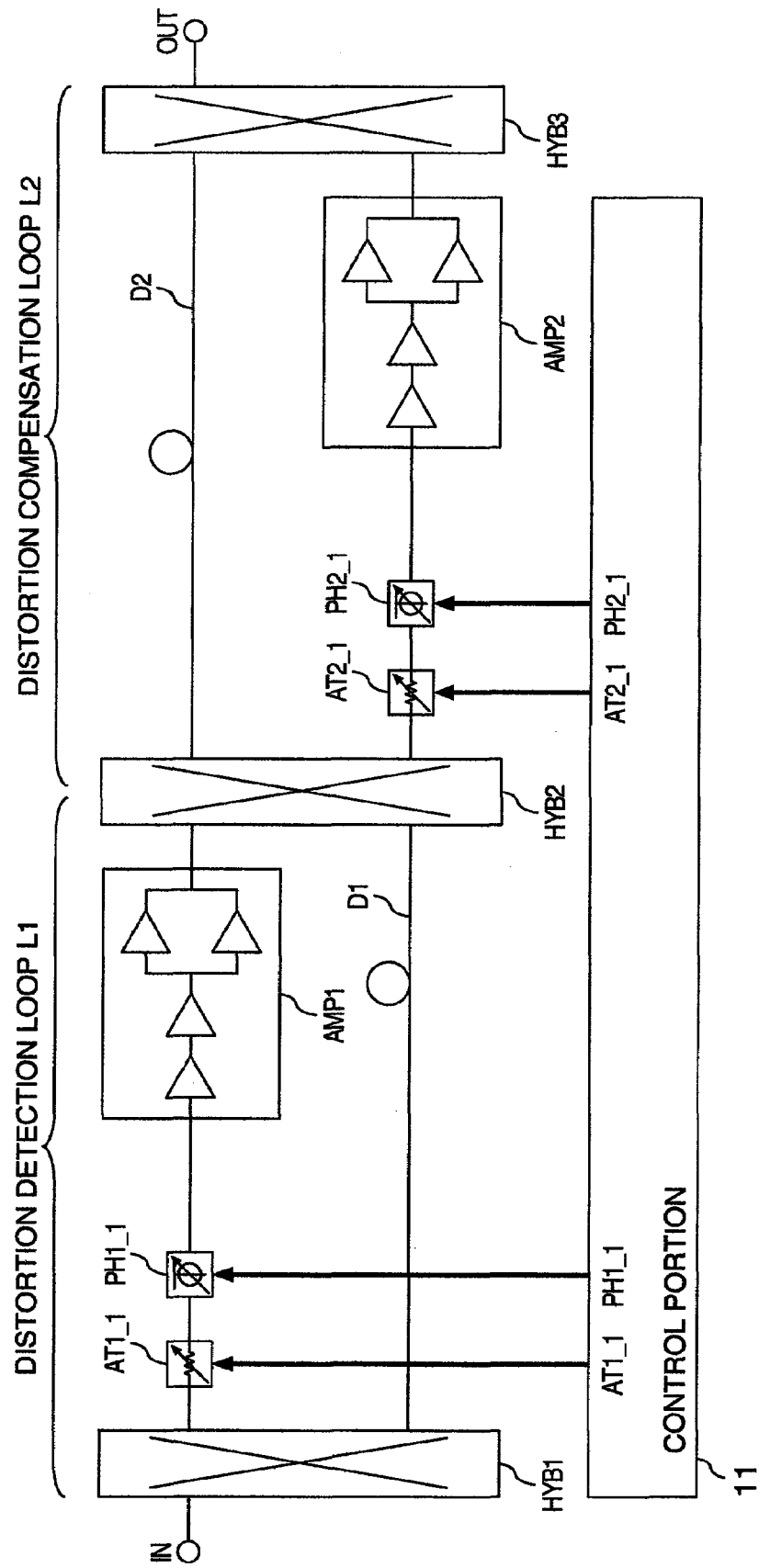
FIG. 4 is a diagram showing an example of configuration of a prior-art feedforward amplifier.
Figure 5:
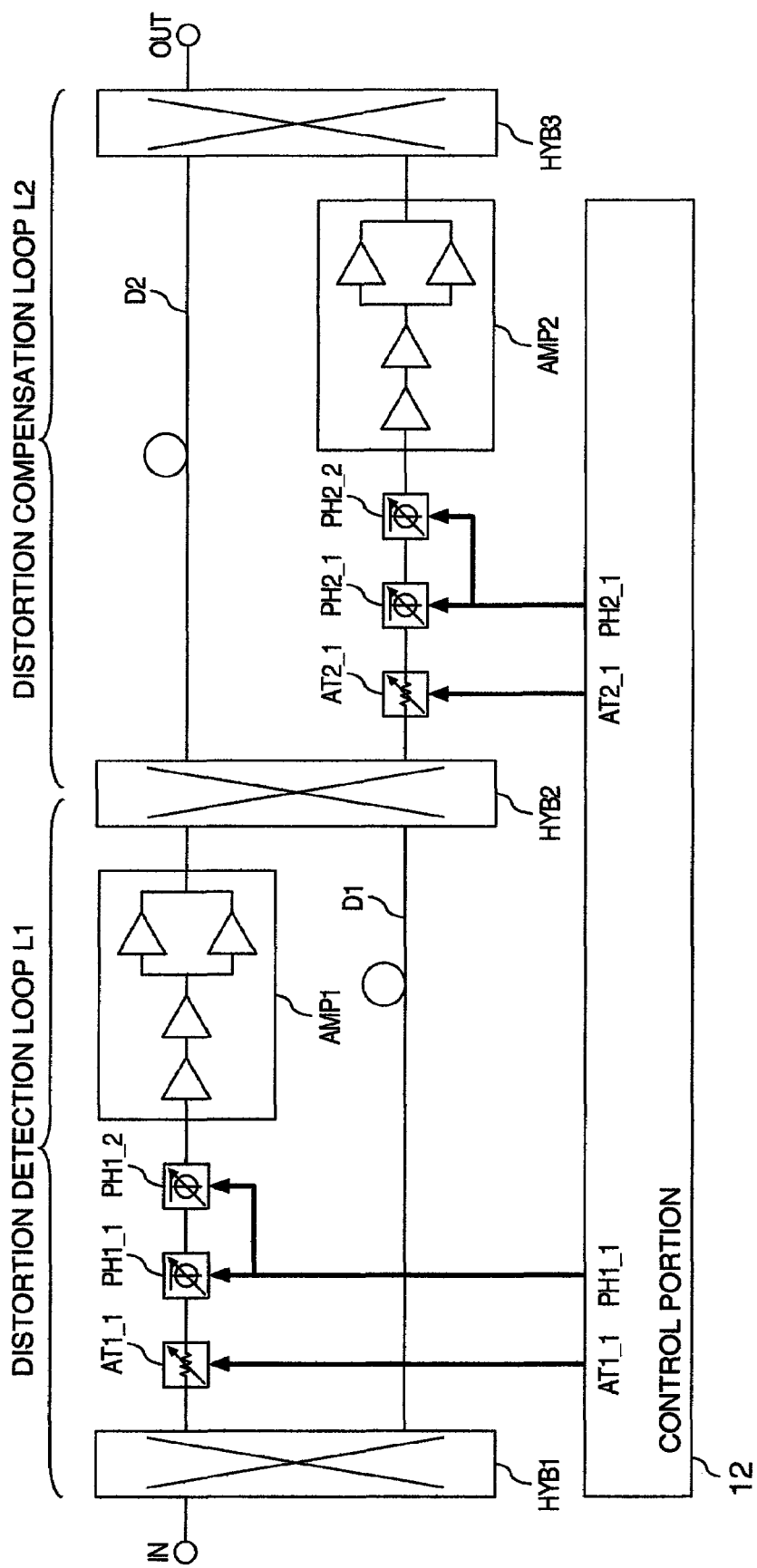
FIG. 5 is a diagram showing an example of configuration of a feedforward amplifier.
Figure 6:
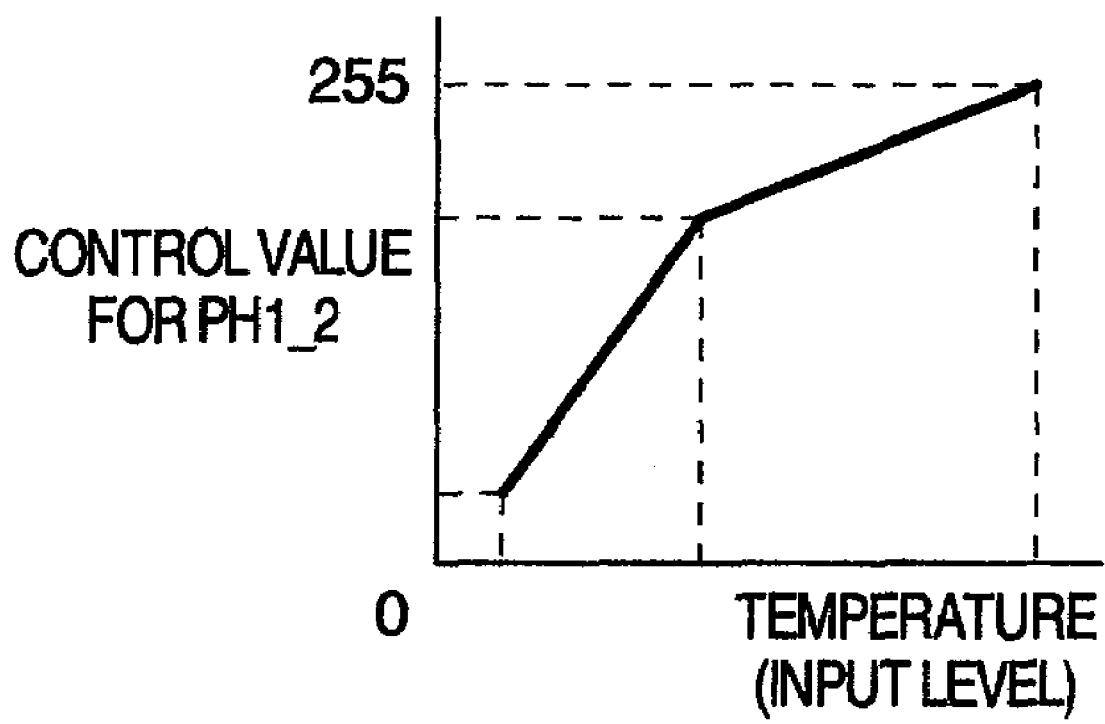
FIG. 6 is a graph showing one example of control value used for a variable phase shifter.

FIG. 3 illustrates one example of a sequence of operations for controlling the variable phase shifters PH1_1 and PH1_2 in the distortion detection loop L1 of the feedforward amplifier of the present embodiment shown in FIG. 1.

In the present embodiment, processing for controlling the variable phase shifters PH1_1 and PH1_2 within the distortion detection loop L1 is described. Processing for controlling the variable phase shifters PH2_1 and PH2_2 within the distortion compensation loop L2 can be processed similarly.

The control method of the present embodiment illustrated in FIG. 3 is similar to the control method illustrated in FIG. 2 except that processing of steps S21, S22, S23, and S24 is added. For convenience of illustration, processing steps of FIG. 3 similar to their counterparts (steps S1-S5 and S11-S16) illustrated in FIG. 2 are indicated by the same reference numerals as in FIG. 2. The differences of the present embodiment with the processing illustrated in FIG. 2 are next described in detail.

In the control method of the present embodiment illustrated in FIG. 3, when the power supply for the feedforward amplifier is switched from OFF state to ON state, the amount of variation in phase in the adjusting variable phase shifter PH1_2 is first initialized (step S21). Then, control goes to the processing of step S1, where the amounts of variation in phase are set to a given value (e.g., 0), for example, to initialize the amounts of variation in phase.

For example, depending on the state in which the feedforward amplifier is stocked, the state of the substrate is varied, for example, due to moisture absorption compared with the state in which the power supply for the amplifier was turned on the previous time. Therefore, it is desired that the initial values of the amounts of phase in phase in the variable phase shifters PH1_2 and PH2_2 are returned to a given value and reset to the original state.

In the control method of the present embodiment, if processing for feedforward optimization is started (step S2), a decision is made as to whether a given time (1 minute in the present embodiment) has passed since the power supply for the feedforward amplifier has been turned on (step S22). If the given time has passed, a decision is made as to whether the temperature has varied rapidly (step S23). If the temperature has not varied rapidly, a decision is made as to whether the input level has varied rapidly (step S24). If the input level has not varied rapidly, control proceeds to the processing of step S3. Meanwhile, if the given time has not passed since the power supply has been turned on (step S22), the temperature has varied rapidly (step S23), or the input level has varied rapidly (step S24), control goes to processing of step S5. If control has not settled down, control returns to the processing of step S1.

During the processing of step S22, the amounts of variations in phase in the adjusting variable phase shifters PH1_2 and PH2_2 are varied after the given time has passed since the power supply has been turned on for the following reason. When the power supply is activated, it takes some time until the operation of the amplifier stabilizes. During this time interval, the amounts of variations in phase in the variable phase shifters PH1_2 and PH2_2 are prevented from being varied.

One example of the configuration for making a decision as to whether the given time has passed since the power supply has been turned on has the function of a timer starting to count the time in response to turning on of the power supply and can determine that the given time has passed since the power supply has been turned on when the time counted by the timer has been equal to or longer than a given time or has passed beyond a given instant of time.

During the processing of step S23, when the temperature varies violently, the amounts of variations in phase in the adjusting variable phase shifters PH1_2 and PH2_2 are prevented from being varied, for the following reason. If violent temperature variations take place, the amplifier does not operate stably. During this time interval, the amounts of variations in phase in the variable phase shifters PH1_2 and PH2_2 are prevented from being varied.

One example of the configuration for making a decision as to whether the temperature is varying violently is equipped with a temperature detector inside or near the feedforward amplifier or at any arbitrary position to detect timewise amounts of variation (or otherwise, rate of variation) of the temperature detected by the temperature detector and can determine that the temperature is varying violently if the timewise amount of variation is in excess of a given threshold value.

In the processing of step S24, the amounts of variations in phase in the adjusting variable phase shifters PH1_2 and PH2_2 are prevented from being varied if the input level is varying violently, for the following reason. If the input level varies violently, the amplifier does not operate stably. During this time interval, the amounts of variations in phase in the variable phase shifters PH1_2 and PH2_2 are prevented from being varied.

One example of the configuration for making a decision as to whether the input level is varying violently can be equipped with a level detector in a stage preceding the feedforward amplifier, the input terminal, or other position where the level of the input signal can be grasped, detects the timewise amounts of variation (or otherwise, rate of variation) of the level detected by the level detector, and determines that the input level is varying violently if the timewise amount of variation is equal to or in excess of a given threshold value.

Because of the processing of the steps S22, S23, and S24, the amounts of variations in phase in the adjusting variable phase shifters PH1_2 and PH2_2 are prevented from being varied when the amplifier does not operate stably.

Furthermore, in the control method of the present embodiment, too, the phase can be varied within a wider range in each of the loops L1 and L2 by performing processing (steps S1-S5 and S11-S16) similar to the processing illustrated in FIG. 2 and permitting the amount of variation in phase of another adjusting variable phase adjuster PH1_2 or PH2_2 to be varied automatically even if the control value for the controlling variable phase shifter PH1_1 or PH2_1 becomes "0" or "255" plural times (three times in the present embodiment).

As described so far, in the feedforward amplifier of the present embodiment, when the power supply is turned on, the phases (amounts of variations in phase) of the adjusting variable phase shifters PH1_2 and PH2_2 are initialized at a given set value. Therefore, if the amplifier is affected by variations in state due to moisture absorption into the substrate during the time interval from the instant when the power supply was turned off the previous time to the instant when the power supply was turned on the present time, control can be started from a given set value (amount of variation in phase) at all times.

Furthermore, in the feedforward amplifier of the present embodiment, the amounts of variations in phase in the adjusting variable phase adjusters PH1_2 and PH2_2 are prevented from being switched immediately after the power supply is turned on or when the temperature or input level is varying violently. Consequently, the amounts of variations in phase in the adjusting variable phase adjusters PH1_2 and PH2_2 can be switched, for example, after the operation has stabilized.

It should be further understood by those skilled in the art that although the foregoing description has been made on embodiments of the invention, the invention is not limited thereto and various changes and modifications may be made without departing from the spirit of the invention and the scope of the appended claim.

The invention claimed is:

1. A feedforward amplifier for compensating for distortion produced in an amplifier, comprising:
    a distortion detection loop for detecting the distortion, the distortion detection loop having an amplification route;
    a distortion compensation loop for compensating for the distortion, the distortion compensation loop having a distortion amplification route;
    a first variable phase shifter for varying phase of a signal;
    a second variable phase shifter for varying the phase of the signal passed through the first variable phase shifter; and
    a phase control portion for controlling an amount of variation in phase in the first variable phase shifter and, the phase control portion, when values of the amount of variation in phase are concentrated toward either ones of relatively-larger directions and relatively-smaller directions, for controlling an amount of variation in phase in the second variable phase shifter according to whether the concentrated directions,
    wherein the first variable phase shifter, the second variable phase shifter and the phase control portion are provided on at least one of the amplification route and the distortion amplification route.

2. A feedforward amplifier for compensating for distortion produced in an amplifier, comprising:
- a distortion detection loop for detecting the distortion, said distortion detection loop having an amplification route;
- a distortion compensation loop for compensating for the distortion, said distortion compensation loop having a distortion amplification route;
- a first variable phase shifter for varying the phase of a signal;
- a second variable phase shifter for varying the phase of the signal passed through said first variable phase shifter; and
- a phase control portion for controlling an amount of variation in the phase in said second variable phase shifter when an amount of variation in the phase in said first variable phase shifter is at a minimum and for controlling the amount of variation in the phase in said second variable phase shifter when the amount of variation in the phase in said first variable phase shifter is at a maximum amount.

3. The feedforward amplifier according to claim 2, wherein said phase control portion controls the amount of variation in the phase in said second variable phase shifter if the number of times the amount of variation in the phase in said first variable phase shifter has been at a minimum or at a maximum amount is equal to or larger than a predetermined value.

* * * * *